United States Patent
Likhanskii et al.

(10) Patent No.: US 9,988,711 B2
(45) Date of Patent: Jun. 5, 2018

(54) APPARATUS AND METHOD FOR MULTILAYER DEPOSITION

(71) Applicant: Varian Semiconductor Equipment Associates, Inc., Gloucester, MA (US)

(72) Inventors: Alexandre Likhanskii, Malden, MA (US); William Davis Lee, Newburyport, MA (US); Svetlana B. Radovanov, Brookline, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 224 days.

(21) Appl. No.: 14/711,989

(22) Filed: May 14, 2015

(65) Prior Publication Data

US 2016/0333464 A1 Nov. 17, 2016

(51) Int. Cl.
 C23C 14/46 (2006.01)
 C23C 14/34 (2006.01)
 C23C 14/22 (2006.01)
 H01J 37/34 (2006.01)

(52) U.S. Cl.
 CPC ............ C23C 14/46 (2013.01); C23C 14/221 (2013.01); C23C 14/3464 (2013.01); H01J 37/3411 (2013.01); H01J 37/3414 (2013.01); H01J 37/3417 (2013.01)

(58) Field of Classification Search
 CPC ... C23C 14/46; C23C 14/3464; C23C 14/221; H01J 37/3411; H01J 37/3417; H01J 37/3426; H01J 37/3429; H01J 37/3432; H01J 37/3414
 See application file for complete search history.

(56) References Cited

U.S. PATENT DOCUMENTS

| 4,155,825 A | 5/1979 | Fournier |
| 4,450,031 A | 5/1984 | Ono et al. |
| 4,523,971 A | 6/1985 | Cuomo et al. |

(Continued)

FOREIGN PATENT DOCUMENTS

| JP | 02159374 A | * | 6/1990 |
| JP | 02159375 A | * | 6/1990 |

OTHER PUBLICATIONS

Machine Translation JP02159375A.*

(Continued)

*Primary Examiner* — Michael A Band (57) ABSTRACT

An apparatus may include an extraction assembly comprising at least a first extraction aperture and second extraction aperture, the extraction assembly configured to extract at least a first ion beam and second ion beam from a plasma; a target assembly disposed adjacent the extraction assembly and including at least a first target portion comprising a first material and a second target portion comprising a second material, the first target portion and second target portion being disposed to intercept the first ion beam and second ion beam, respectively; and a substrate stage disposed adjacent the target assembly and configured to scan a substrate along a scan axis between a first point and a second point, wherein the first target portion and second target portion are separated from the first point by a first distance and second distance, respectively, the first distance being less than the second distance.

12 Claims, 5 Drawing Sheets

(56) References Cited

U.S. PATENT DOCUMENTS

| | | | |
|---|---|---|---|
| 4,716,340 A * | 12/1987 | Lee ..................... | H01J 37/3405 204/298.18 |
| 5,334,302 A * | 8/1994 | Kubo .................. | C23C 14/3407 204/298.07 |
| 5,492,605 A | 2/1996 | Pinarbasi | |
| 5,825,038 A | 10/1998 | Blake et al. | |
| 6,413,380 B1 | 7/2002 | Pinarbasi | |
| 6,669,824 B2 * | 12/2003 | Sferlazzo .............. | C23C 14/044 118/723 FI |
| 9,136,096 B2 * | 9/2015 | Godet ................. | H01J 37/3467 |
| 2001/0015319 A1 | 8/2001 | Choe et al. | |
| 2004/0084299 A1 | 5/2004 | Slaughter et al. | |
| 2005/0167261 A1 * | 8/2005 | Deutchman ............. | C23C 14/46 204/192.11 |
| 2006/0060559 A1 | 3/2006 | Fang et al. | |
| 2014/0090973 A1 * | 4/2014 | Sortais ................ | C23C 14/3464 204/192.11 |

OTHER PUBLICATIONS

International Search Report and Written Opinion dated Sep. 12, 2016 (Sep. 12, 2016) in corresponding international patent application No. PCT/US2016/031746.

Basil Gavin, "Anode Sputtering Characteristics of the Berkeley 2.5 MV Source," IEEE Transactions on Nuclear Science, vol. NS-23, No. 2, pp. 1008-1012 (Apr. 1976).

B.F. Gavin, "A Sputtering Type Penning Discharge for Metallic Ions," Nuclear Instruments and Methods, vol. 64, pp. 73-76 (Apr. 1968).

B.H. Wolf, "Duopigatron Metal Ion Source," Nuclear Instruments and Methods, vol. 139, pp. 13-16 (1976).

B.H. Wolf, "Handbook of Ion Sources," CRC Press, pp. 54-59 (1995).

* cited by examiner

APPARATUS AND METHOD FOR MULTILAYER DEPOSITION

FIELD

The present embodiments relate to processing apparatus and methods, and more particularly, to components and methods to control processing in ion implantation processes.

BACKGROUND

In the present day many techniques are available to deposit films including chemical vapor deposition, physical vapor deposition and other techniques. In order to process complex structures such as multilayer films, depositing a series of layers within a lone process chamber may be useful. Deposition of certain materials such as metals may be performed using various sputtering or other physical vapor deposition techniques. For multilayer deposition this may entail the use of multiple different targets where the different targets are made of different materials. In some cases, ion beam sputtering may be used to sputter multiple different targets in order to deposit a multi-layer structure. This provides a flexible approach where a multilayer structure composed of a given combination of different materials may be deposited to the extent targets are available for the different materials.

Problems associated with known ion beam sputtering approaches include the ability to provide uniform coatings such as multilayer structures. Uniformity may be compromised by non-uniform extraction of an ion beam from an ion source used for ion beam sputtering, as well as non-uniform sputtering of material from a target or targets used to deposit a layer. Additionally, some techniques for multilayer deposition may entail changing of targets to deposit different materials. Excessive handling of targets during deposition of a multilayer structure in turn may generate defects in a final structure because of flaking and other contamination.

With respect to these and other considerations the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, an apparatus may include an extraction assembly comprising at least a first extraction aperture and second extraction aperture, the extraction assembly configured to extract at least a first ion beam and second ion beam from a plasma. The apparatus may also include a target assembly disposed adjacent the extraction assembly and including at least a first target portion comprising a first material and a second target portion comprising a second material, the first target portion and second target portion being disposed to intercept the first ion beam and second ion beam, respectively. The apparatus may include a substrate stage disposed adjacent the target assembly and configured to scan a substrate along a scan axis between a first point and a second point, wherein the first target portion and second target portion are separated from the first point by a first distance and second distance, respectively, the first distance being less than the second distance.

In another embodiment, a processing apparatus may include a plasma chamber to house a plasma an extraction assembly comprising at least a first extraction aperture and second extraction aperture, the extraction assembly configured to extract at least a first ion beam and second ion beam from the plasma. The processing apparatus may also include a target assembly disposed adjacent the extraction assembly and including at least a first target portion comprising a first material and a second target portion comprising a second material, the first target portion and second target portion being disposed to intercept the first ion beam and second ion beam, respectively, and a substrate stage disposed adjacent the target assembly and configured to scan a substrate between a first point and a second point, wherein the first target portion and second target portion are separated from the first point by a first distance and second distance, respectively, the first distance being less than the second distance.

In a further embodiment an apparatus may include a plasma chamber to house a plasma and an extraction assembly comprising a first extraction aperture and second extraction aperture, the extraction assembly configured to extract a first ion beam and second ion beam from the plasma via the first extraction aperture and second extraction aperture, respectively. The apparatus may also include a target assembly disposed adjacent the extraction assembly and including at least a first target portion comprising a first material, the target assembly being disposed to intercept the first ion beam and a biasing system including a target bias supply to bias the target assembly negatively with respect to the plasma chamber, and a substrate bias supply to apply a substrate bias voltage to bias the substrate negatively with respect to the plasma chamber. The apparatus may further include a substrate stage configured to scan a substrate between a first location adjacent the first extraction aperture and a second location adjacent the second extraction aperture.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The embodiments described herein provide novel processing apparatus and methods to process substrates. Various embodiments provide apparatus for convenient deposition of multiple layers on a substrate. Some embodiments provide apparatus for etching of a substrate in addition to deposition of at least one layer on the substrate.

Figure 1A:
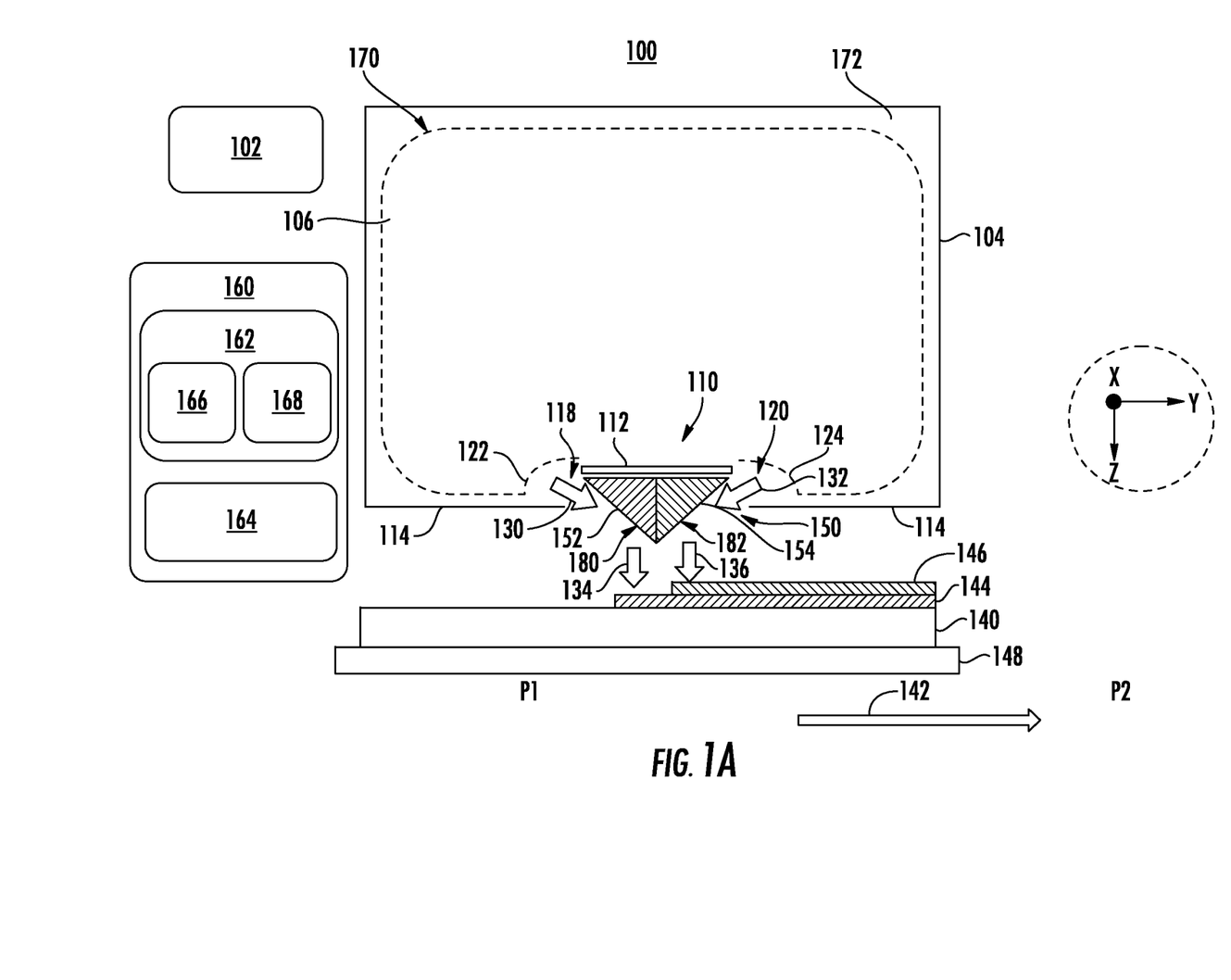
FIG. 1A illustrates a side view of a processing apparatus consistent with various embodiments of the disclosure.

FIG. 1A illustrates a side view of a processing apparatus 100 in accordance with various embodiments of the disclosure. The processing apparatus 100 includes a plasma source 102 configured to generate a plasma 106 in a plasma chamber 104. The plasma source 102 may, in various embodiments, be an in situ source or remote source, an inductively coupled plasma source, capacitively coupled plasma source, helicon source, microwave source, arc source, or any other type of plasma source. The embodiments are not limited in this context. The processing apparatus 100 further includes a biasing system 160 including a target bias supply 162 to bias the target assembly with respect to the plasma chamber 104, as well as a substrate bias supply 164 to bias the substrate with respect to the plasma chamber 104. The biasing system 160 may be used to extract ion beams to process a substrate 140 in different ways, as detailed below.

The processing apparatus 100 further includes an extraction assembly 110 disposed adjacent the target assembly 150. The extraction assembly 110 may include a first extraction aperture and second extraction aperture in some embodiments. These apertures are illustrated as extraction aperture 118 and extraction aperture 120 in FIG. 1A. The extraction aperture 118 and extraction aperture 120 are defined by a central portion 112 of the extraction assembly 110, as well as outer portions 114 of the extraction assembly 110. In various embodiments, the extraction assembly 110 may be electrically conductive and may be electrically conductively connected to the plasma chamber 104. In particular the extraction assembly may be operative to receive the same voltage as the plasma chamber 104. For example, in some modes of operation the extraction assembly 110 and plasma chamber 104 may be placed at ground potential by the biasing system 160, while in other modes of operation, the extraction assembly 110 and plasma chamber 104 may be placed at the same positive voltage (potential) with respect to ground.

The processing apparatus 100 may further include a target assembly 150 disposed adjacent to the extraction assembly 110 as shown in FIG. 1A. The target assembly 150 may include a plurality of target portions. In the example of FIG. 1A, the target assembly includes a first target portion 152 and second target portion 154.

In one example of operation, when the plasma 106 is generated in the plasma chamber 104, and the target assembly 150 is biased negatively with respect to the plasma chamber 104, a first ion beam containing positive ions may be extracted through the extraction aperture 118 and second ion beam may be extracted through the extraction aperture 120. These ion beams are shown as the ion beam 130 and ion beam 132, respectively. As further illustrated in FIG. 1A, the boundary 170 between the plasma and plasma sheath 172 may form a meniscus 122 in the extraction aperture 118 and a meniscus 124 in the extraction aperture 120. The exact shape of the meniscus 122 and meniscus 124 may be controlled by factors such as plasma power, gas pressure in the plasma chamber 104, and other factors. The shape and orientation of the meniscus 122 may cause ions in the ion beam 130 to have an average trajectory as represented by the arrow depicting ion beam 130. Similarly, the shape and orientation of the meniscus 124 may cause ions in the ion beam 132 to have an average trajectory as represented by the arrow depicting ion beam 132. In some particular examples, at higher plasma power, such as 1-5 kW, the ion beam 130 and ion beam 132 may tend to have trajectories striking the target assembly 150. As illustrated in FIG. 1A, the first target portion 152 may intercept the ion beam 130 and the second target portion 154 may intercept the ion beam 132. The first target portion 152 may include a first material, where the first material is to be deposited on the substrate 140. The ion beam 130 may include ions configured to sputter etch the first material, and direct first material 134 to the substrate 140 as shown by the vertical arrow. The second target portion 154 may include a second material, where the second material is also to be deposited on the substrate 140. The ion beam 132 may include ions configured to sputter etch the second material, and direct the second material 136 to the substrate 140 as shown by the vertical arrow. Suitable ions for the ion beam 130 and ion beam 132 include inert gas ions, reactive ions such as oxygen or nitrogen, or other ions.

As further shown in FIG. 1A, the processing apparatus 100 may also include a substrate stage 148 disposed adjacent the target assembly 150. The substrate stage 148 may be configured to scan a substrate along a scan axis 142 between a first point P1 and a second point P2. In FIG. 1A the scan axis 142 may lie parallel to the Y axis of the Cartesian coordinate system shown. Advantageously, the target assembly 150 is arranged wherein the first target portion 152 is separated from the first point P1 by a first distance and the first target portion 152 is separated from the first point P1 by a second distance greater than the first distance. In this manner as the substrate stage 148 scans the substrate 140 along the scan axis 142 from the first point P1 to the second point P2, the substrate 140 may intercept the first material 134 sputter from the first target portion 152 before intercepting the second material 136 sputtered from the second target portion 154. In this manner, a first layer 144 of the first material 134 is deposited on the substrate 140, while a second layer 146 of the second material 136 is deposited on the first layer 144.

Figure 1B:
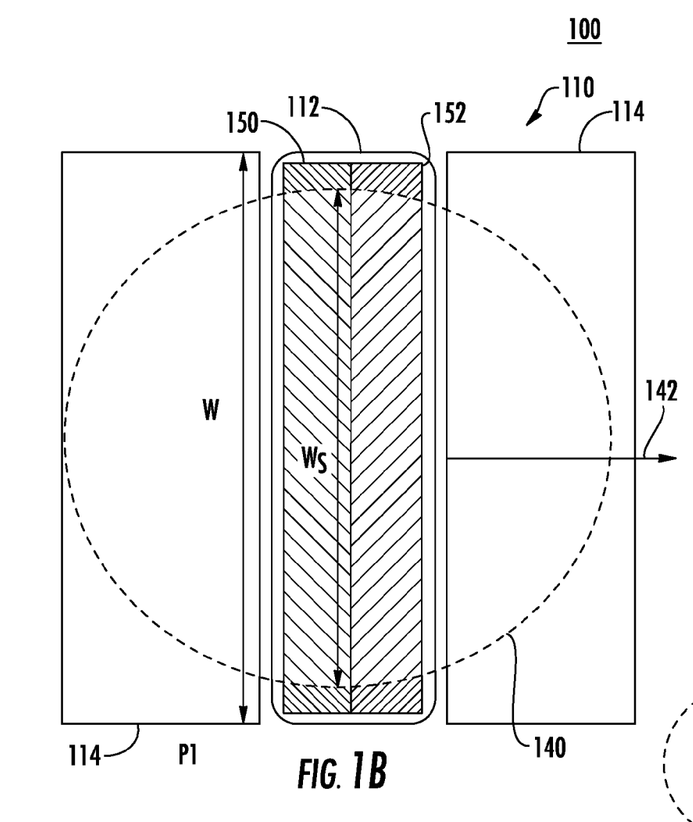
FIG. 1B illustrates a bottom plan view of a portion of the apparatus of FIG. 1A according to some embodiments.

In various embodiments the target assembly 150 may comprise a polygonal cross-section, such as a triangular cross-section as shown. In various embodiments, the target assembly 150 may be elongated along the X-axis as shown in the embodiment of FIG. 1B. The target assembly 150 may have a width W along the X-direction equal to or greater than the width Ws of substrate 140 along the X-direction. For example, in some embodiments the width W may be greater than 300 mm. In this manner, the first layer 144 and second layer 146 shown in FIG. 1A may cover the substrate 140 its entirety when first material 134 and second material 136 are sputtered while the substrate 140 is scanned along the scan axis 142 with respect to the extraction assembly from point P1 to point P2.

In various embodiments, the substrate 140 may be provided at a separation along the Z-axis from the target assembly 150 of several millimeters to several centimeters. This close distance facilitates more rapid deposition of material on the substrate 140 during a scan.

Figure 1C:
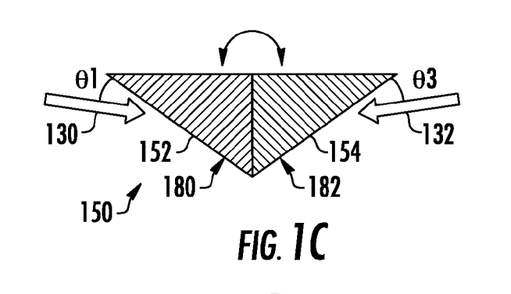
FIG. 1C illustrates details of geometry for sputtering material from a target assembly in a first configuration.
Figure 1D:
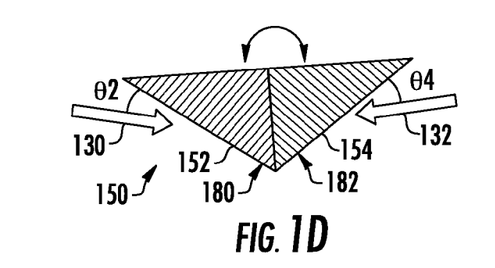
FIG. 1D illustrates details of geometry for sputtering material from a target assembly in a second configuration.

In various embodiments, the first target portion 152 may have a first face 180. The first face 180 may have a flat shape, concave shape, or convex shape in different embodiments. The second target portion 154 may likewise have a second face 182, where the second face is flat, concave, or convex in different embodiments. When the ion beam 130 strikes the first face 180, the ion beam may define an angle of incidence with respect to the first face. Likewise, the ion beam 132 may define an angle of incidence with respect to the second face 182. In some embodiments, the target assembly 150 may be rotatable along a rotation axis lying parallel to the X-axis, as shown in FIG. 1C. Accordingly, in a first configuration as shown in FIG. 1C, the ion beam 130 may define a first angle of incidence θ1 with respect to the first face 180. When the target assembly 150 is rotated to a second configuration, shown in FIG. 1D, the ion beam 130 defines a second angle of incidence θ2 with respect to the first face 180. Likewise, in the first configuration as shown in FIG. 1C, the ion beam 132 may define a third angle of incidence θ3 with respect to the first face 180. When the target assembly 150 is rotated to the second configuration, shown in FIG. 1D, the ion beam 132 defines a fourth angle of incidence θ4 with respect to the first face 180. Referring again to FIG. 1A, since the angular distribution of sputtered material from a target may depend on angle of incidence of ions with respect to a target surface, the angular distribution of the first material 134 as well as the angular distribution of the second material 136 may be varied by rotating the target assembly 150.

Advantageously, the target assembly 150 may be rotated during scanning of the substrate 140 or between a first scan of substrate 140 and a second scan of substrate 140 in order to direct material from the target assembly 150 to the substrate 140 over different angular distributions. This may be useful when coating a different surfaces of a three dimensional structure where the different surfaces may form different angles of inclination with respect to the X-Y plane, for example.

As further shown in FIG. 1A, the target bias supply 162 may include a plurality of bias supplies. In one example the target bias supply 162 may include a first voltage supply 166 to apply a first target bias to the first target portion 152 and a second voltage supply 168 to apply a second target bias to the second target portion 154. These voltage supplies may act independently of one another wherein the same voltages or different voltages may be applied to the first target portion 152 and second target portion 154. In one example of operation the biasing system 160 may place the plasma chamber 104 at ground potential and the target assembly 150 at a negative voltage so the target assembly 150 is biased negatively with respect to the plasma chamber 104. For example, the first target portion 152 may be biased at −1000 V. The second target portion 154 may also be biased at −1000 V in one example, or may be biased at a different negative voltage. Singly charged ions extracted from the plasma 106 may therefore strike the first target portion 152 with an energy of approximately 1000 eV, not accounting for the exact potential of the plasma 106, often being 5V to 50V more positive than the potential of the plasma chamber 104.

Figure 2A:
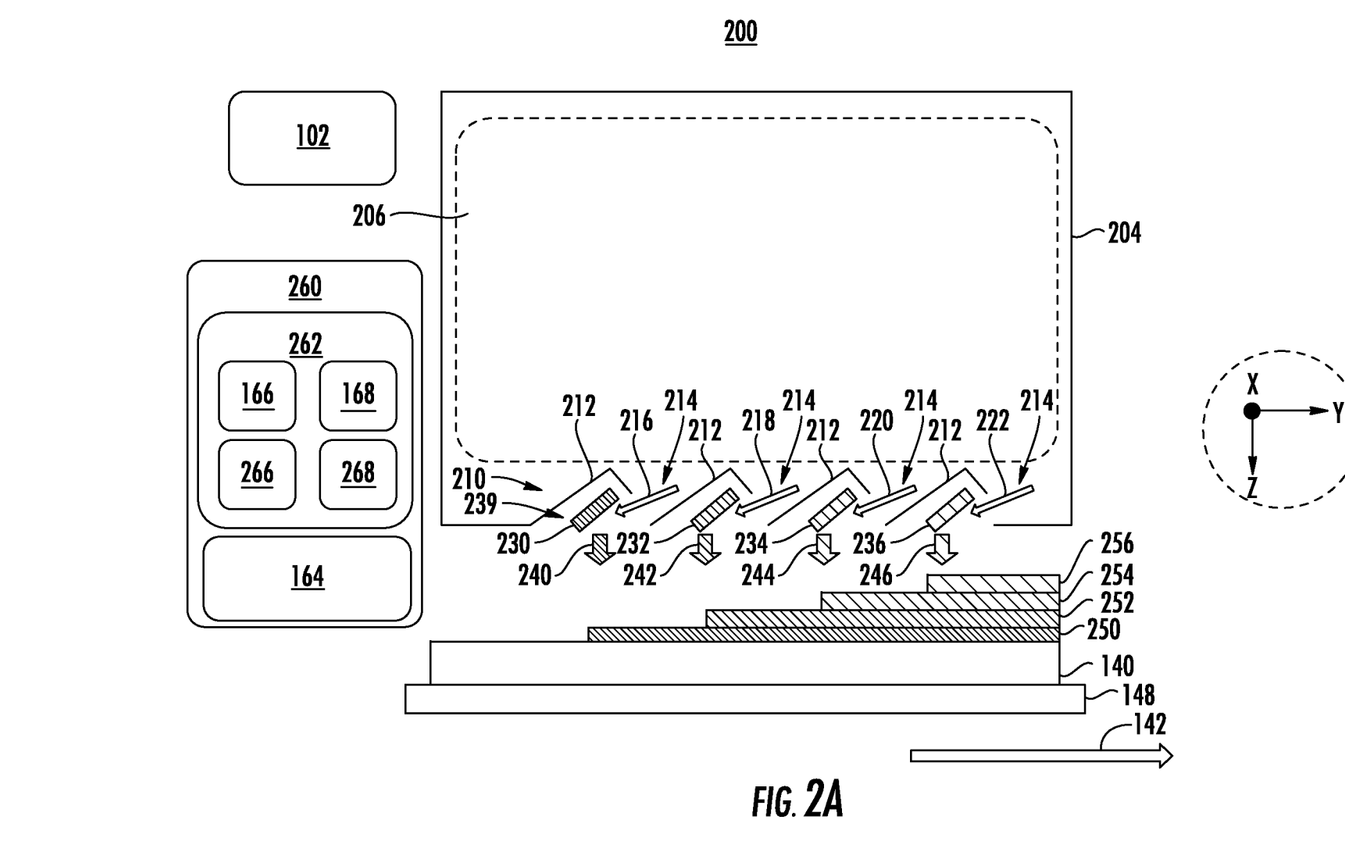
FIG. 2A illustrates a side view of another processing apparatus during one instance of operation according to embodiments of the disclosure.

In various additional embodiments, different target assembly configurations than the geometry shown in FIG. 1A may be provided to deposit multilayer structures on a substrate. FIG. 2A illustrates a side view of another processing apparatus 200 during a first mode of operation according to various embodiments of the disclosure. In this embodiment, the processing apparatus 200 may share those components with the processing apparatus 100 including the plasma source 102 and substrate stage 148. The plasma chamber 204 may house a plasma 206 generated by the plasma source 102. In this embodiment an extraction assembly 210 includes four different extraction apertures, shown as the extraction apertures 214. In other embodiments, a processing apparatus may have fewer or a larger number of extraction apertures. The extraction assembly further includes a plurality of baffles, shown as baffles 212, and having surfaces arranged at a non-zero angle with respect to the X-Y plane as shown. As illustrated in FIG. 2A, a target portion may be disposed adjacent a given baffle. In various embodiments at least three target portions may be disposed adjacent respective extraction apertures. In FIG. 2A four different target portions are shown, including a target portion 230, target portion 232, target portion 234, and target portion 236. These target portions may together constitute a target assembly 239. A given target portion may also be inclined at a non-zero angle with respect to the X-Y plane as shown. A target portion such as target portion 230 may present a surface exposed to ions extracted from the plasma 206. For example, an ion beam 216 may be extracted from the plasma 206 and directed to the target portion 230; an ion beam 218 may be extracted from the plasma 206 and directed to the target portion 232; an ion beam 220 may be extracted from the plasma 206 and directed to the target portion 234; and an ion beam 222 may be extracted from the plasma 206 and directed to the target portion 236. In some examples, the target portion 230 may comprise a first material, the target portion 232 may comprise a second material, the target portion 234 may comprise a third material, and the target portion 236 may comprise a fourth material. In other embodiments, at least two of the target portions may constitute the same material.

The distance from point P1 may vary between the different target portions as shown. Accordingly, when the substrate stage 148 scans the substrate 140 from point P1 to point P2 along the scan axis 142, for example, a given part of the substrate 140 may pass under the different targets in a sequential fashion. In this manner the substrate 140 may intercept the target material 240 sputtered from the target portion 230 before intercepting the target material 242 sputtered from the target portion 232. Likewise the substrate 140 may intercept the target material 242 sputtered from the target portion 232 before intercepting the target material 244 sputtered from the target portion 234. Additionally, the substrate 140 may intercept the target material 244 sputtered from the target portion 234 before intercepting the target material 246 sputtered from the target portion 236. In this manner, a first layer 250 of the target material 240 is deposited on the substrate 140, while a second layer 252 of the target material 242 is deposited on the first layer 250. A third layer 254 of target material 244 is deposited on the second layer 252, while a fourth layer of target material 256 is deposited on the third layer 254.

As further illustrated in FIG. 2A, a biasing system 260 may include target bias supply 262 including a plurality of bias supplies. In one example the target bias supply 162 may include a separate voltage supply for a given target portion of a target assembly. In the example of FIG. 2A, the target bias supply may include: a first voltage supply 166 to apply a first target bias to the target portion 230; a second voltage supply 168 to apply a second target bias to the target portion 232; a third voltage supply 266 to apply a third target bias to the target portion 234; and a fourth voltage supply 268 to apply a fourth target bias to the target portion 236. These voltage supplies may act independently of one another wherein the same or different voltages may be applied to the different target portions.

In some examples, a substrate such as substrate 140 may be scanned multiple times between points P1 and P2. In addition, the substrate 140 may be scanned back and forth between P1 and P2 or just in one direction. In some embodiments, at least one target portion of the target assembly 239 may be held at the same potential as plasma chamber 204 during scanning of the substrate 140. In this manner, no sputtering may take place at the at least one target portion. Accordingly, deposition of a layer of a given material of the target portion not biased negatively with respect to the plasma chamber may be omitted during a given scan. As a result, any sequence of layers from target material 240, target material 242, target material 244, and target material 246 may be produced by the processing apparatus 200.

In additional embodiments, the biasing system 260 may vary the voltages applied to different components of the processing apparatus 200 in a manner generating etching of the substrate 140 as well as deposition on the substrate 140. In some embodiments, the plasma chamber 104 may be placed by the biasing system 260 at ground potential while at least one target portion of the target assembly is placed at a negative potential, such as −1000 V. Alternatively, the at least on target portion may be placed at another suitable negative voltage such as −2000 V to −5000 V. The embodiments are not limited in this context. In this manner when a given region of the substrate 140 passes under the at least one target portion biased negatively with respect to the plasma chamber 104, sputtered material from the at least one target portion may deposit on the given region of the substrate. Additionally, at least one other target portion may be placed at ground potential, resulting in no etching of the at least one other target portion, since under this condition, ions are not attracted from the plasma 206 with adequate energy to cause sputtering. Moreover, the biasing system 260 may place the substrate 140 at a negative potential with respect to the plasma chamber 204.

Figure 2B:
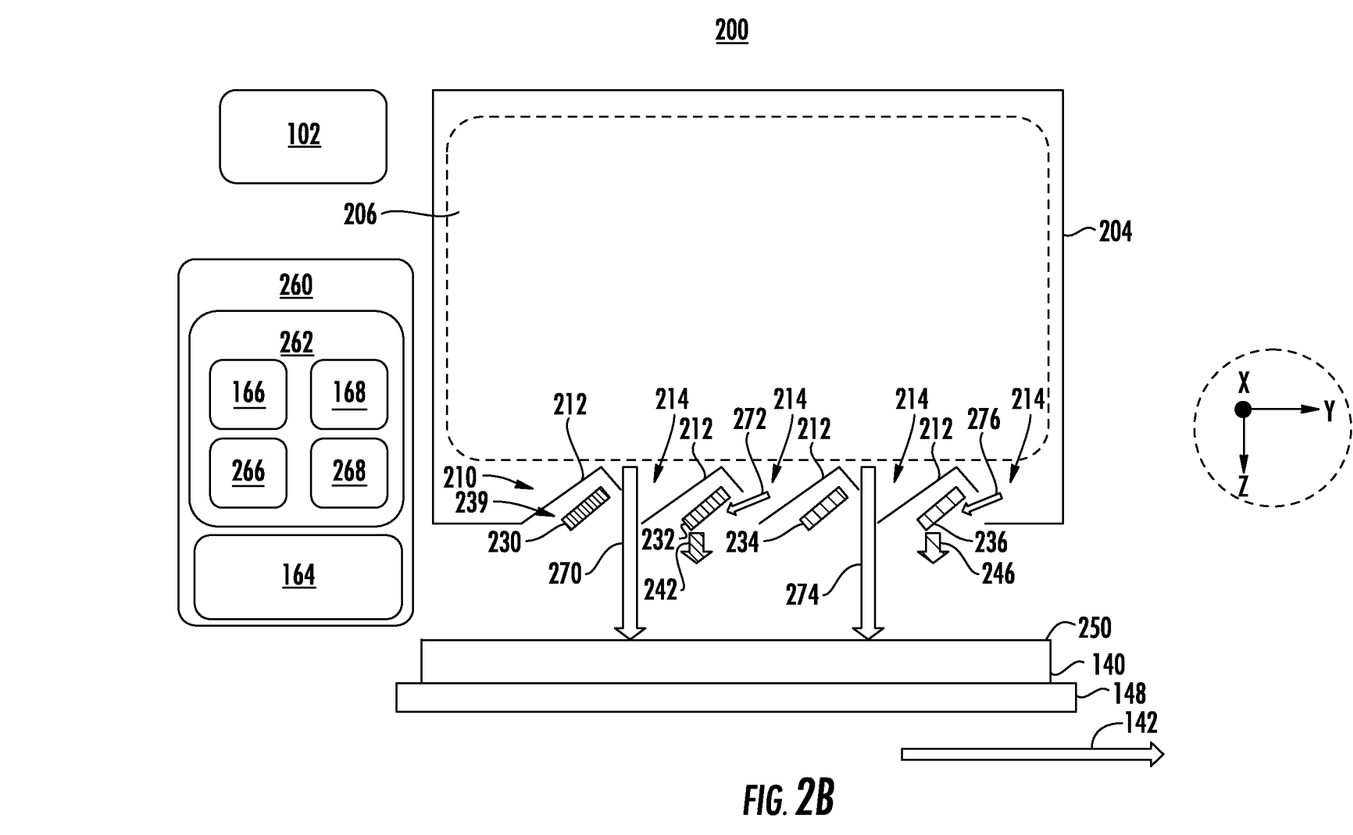
FIG. 2B illustrates a side view of the processing apparatus of FIG. 2A during another instance of operation.

For purposes of illustration, in one specific example illustrated in FIG. 2B, plasma chamber 104, target portion 230, and target portion 234 may be placed at ground potential by biasing system 260. The target portion 232 and target portion 236 may be placed at −1000 V by biasing system 260. Finally the biasing system 260 may place the substrate 140 (substrate stage 148) at −500 V. In this scenario, target material 242 may be sputtered from the target portion 232 and directed to the substrate 140, and target material 246 may be sputtered from the target portion 236 and also directed to the substrate 140. Additionally, in the extraction aperture 214 located between target portion 230 and target portion 232, ions may be extracted from the plasma 206 and directed as an ion beam 270 to the substrate 140. Moreover, in the extraction aperture 214 located between target portion 234 and target portion 236, ions may be extracted from the plasma 206 and directed as an ion beam 274 to the substrate 140. Notably, because just a small potential difference (e.g., 10 V) may exist between plasma 206 and the target portion 230 as well as target portion 234, ions extracted from the plasma 206 are directed downwardly toward the substrate (at −500 V) as shown by the arrow trajectories in the ion beam 270 and ion beam 274. Therefore, the target portion 230 and target portion 234 are not sputtered by ions. Additionally, because the bias voltage (−1000 V) applied to target portion 232 and target portion 236 is much greater than the bias voltage (−500 V) applied to the substrate 140, the ion beam 272 is directed to the target portion 232 and may not strike the substrate 140. Likewise, the ion beam 276 is directed to the target portion 236 and may not strike the substrate 140.

In the above manner ions beams may be directed in different apertures of the extraction assembly 210 to strike a given target portion for deposition of target material, or to directly strike the substrate to generate etching. Notably, in the scenario of FIG. 2B, when the substrate 140 is scanned along the scan axis 142, different patterns of deposition and etching may be created by control of scan speed as well as duration of the different voltages applied to the different target portions or to the substrate 140.

Moreover, in other configurations to generate a similar result as in FIG. 2B, the substrate 140 may be grounded and the plasma chamber 104 may be placed at a positive potential with respect to ground. For example, while substrate 140 is grounded, the plasma chamber 104, target portion 230, and target portion 234 may be placed at +500 V, and target portion 232 and target portion 236 may be placed at −500 V.

Figure 3A:
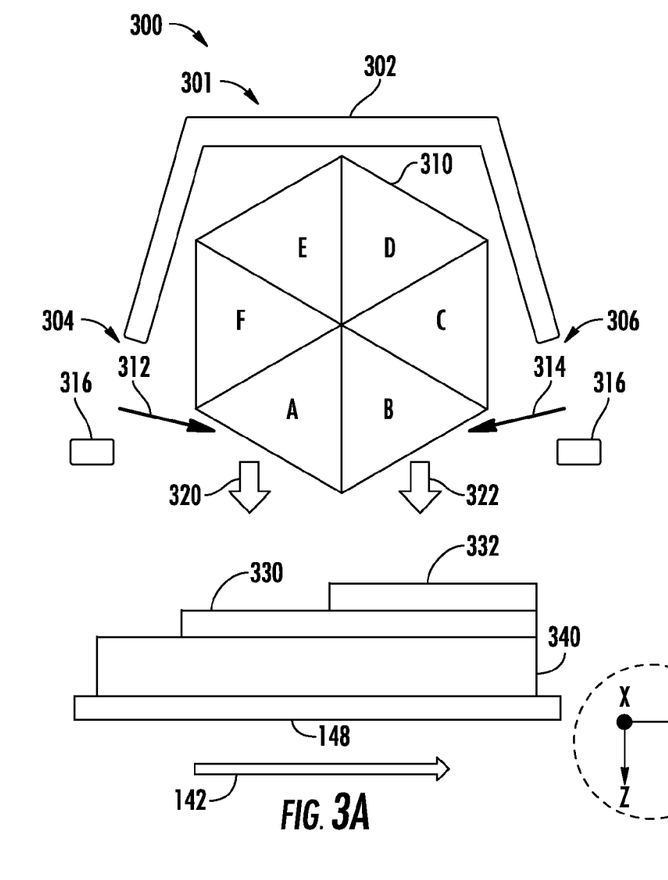
FIG. 3A depicts a first configuration of an apparatus for multilayer deposition during a first instance.

FIG. 3A depicts a first configuration of an apparatus 300 for multilayer deposition during a first instance. The apparatus 300 may include an extraction assembly 301 having a central portion 302 and outer portions 316. The apparatus 300 may also include a target assembly 310 including multiple target portions. The central portion 302 and outer portions 316 may define an extraction aperture 304 and extraction aperture 306. During operation, the apparatus 300 may be located in a processing apparatus for depositing multilayer films. A plasma (omitted for clarity) may be generated, serving as a source for the ion beam 312 directed through the extraction aperture 304, as well as for the ion beam 314 directed through the extraction aperture 306. As illustrated, the target assembly 310 may have multiple target portions, including target portion A, target portion B, target portion C, target portion D, target portion E, and target portion F. The embodiments are not limited in this context. The target portions may have wedge shapes where a given target portion presents an external face. The target assembly 310 may be rotatable about a rotation axis lying parallel to the X-axis. In one scenario of operation shown in FIG. 3A, the target assembly 310 may be arranged in a configuration where the ion beam 312 strikes the target portion A, causing material of target portion A to be sputtered and directed as target material 320 to the substrate 340. In this configuration the ion beam 314 may strike the target portion B, causing material of target portion B to be sputtered and directed as target material 322 to the substrate 340. When the substrate 340 is scanned in a first scan from left to right along the scan axis 142, a first layer 330 of target material 320 may be deposited on substrate 340, while a second layer 332 of target material 322 is deposited on first layer 330.

Figure 3B:
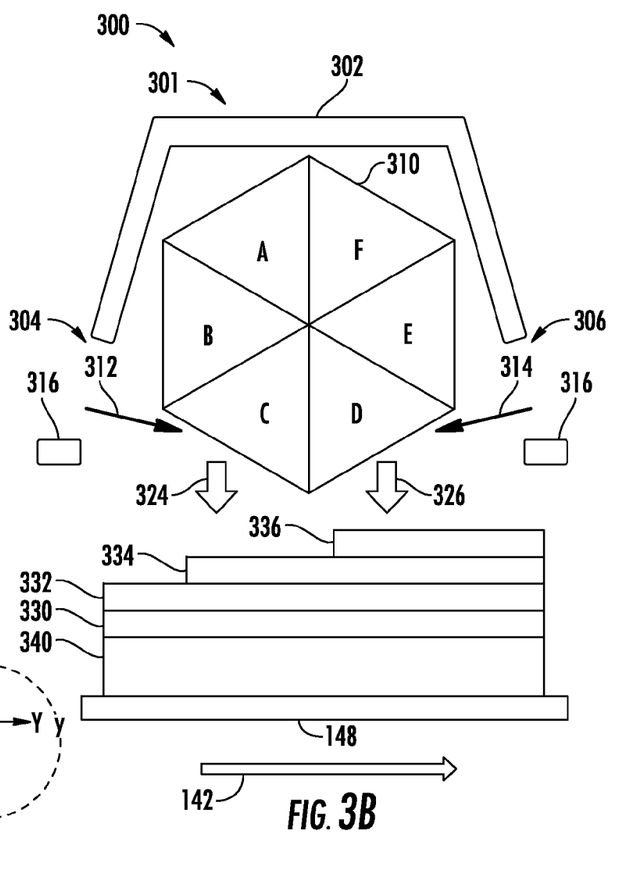
FIG. 3B depicts a second configuration of the apparatus of FIG. 3A during a second instance.

In a subsequent instance, the target assembly 310 may be rotated about the rotation axis to the configuration shown in FIG. 3B. In this configuration the ion beam 312 may strike the target portion C, causing material of target portion C to be sputtered and directed as target material 324 to the substrate 340. In this configuration the ion beam 314 may strike the target portion D, causing material of target portion D to be sputtered and directed as target material 326 to the substrate 340. When the substrate 340 is scanned in a second scan from left to right along the scan axis 142, a third layer 334 of target material 324 may be deposited on substrate 340, while a fourth layer 336 of target material 326 is deposited on third layer 334.

In various additional embodiments a target assembly similar to the target assembly shown in FIG. 3A may present multiple different target portions to a given ion beam simultaneously. For example, target portion F and target portion A may be exposed simultaneously to the same ion beam. This may generate a layer having a composition having a mixture of material from target portion F and target portion A.

An advantage afforded by the present embodiments includes the ability to deposit multiple layers on a substrate in one scan of the substrate in a compact apparatus where a substrate may be provided adjacent a plasma chamber.

Another advantage is avoiding changing of targets to deposit multiple different layers. A further advantage is the ability to etch and deposit on a substrate using ions extracted from one plasma chamber adjacent the substrate. A further advantage is the ability to tailor the direction of depositing material on a substrate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An apparatus, comprising:
   an extraction assembly comprising at least a first extraction aperture and second extraction aperture, the extraction assembly configured to extract at least a first ion beam and second ion beam from a plasma chamber;
   a target assembly disposed adjacent the extraction assembly and including at least a first target portion comprising a first material and a second target portion comprising a second material, the first target portion and second target portion being disposed to intercept the first ion beam and second ion beam, respectively, wherein the first extraction aperture and the second extraction aperture are elongated along a first direction, wherein the first target portion and the second target portion extend parallel to the first extraction aperture and the second extraction aperture along the first direction;
   a substrate stage disposed adjacent the target assembly and configured to scan a substrate along a scan axis between a first point and a second point, wherein the first target portion and second target portion are separated from the first point by a first distance and second distance, respectively, the first distance being less than the second distance; and
   wherein the target assembly is disposed between the extraction assembly and the substrate, the substrate stage and the substrate are outside the plasma chamber, and wherein at least a portion of the target assembly extends into the plasma chamber.

2. The apparatus of claim 1, wherein when the substrate stage scans the substrate between the first point and second point, a first layer of the first material is deposited on the substrate and a second layer of a second material is deposited on the first layer.

3. The apparatus of claim 1, wherein the target assembly comprises at least three target portions, and wherein the target assembly is rotatable about a rotation axis, wherein in a first configuration the first target portion and second target portion are exposed to the first ion beam and second ion beam, respectively, and wherein in a second configuration a third target portion comprising a third material is exposed to the first ion beam.

4. The apparatus of claim 1, wherein the first target portion comprises a first face, wherein the first target portion is rotatable along a rotation axis perpendicular to the scan axis, wherein in a first orientation the first ion beam forms a first angle of incidence with respect to the first face, and wherein in a second orientation the first ion beam forms a second angle of incidence with respect to the first face.

5. The apparatus of claim 1, wherein the first target portion and second target portion have a first face and a second face, respectively, the first face and second face having a flat shape, a concave shape, or a convex shape.

6. The apparatus of claim 1, wherein the target assembly comprises a third target portion comprising a third material, wherein the third target portion is disposed at a third distance from the first point greater than the second distance, and wherein the extraction assembly comprises a third extraction aperture configured to extract a third ion beam from the plasma, the third target portion configured to intercept the third ion beam.

7. The apparatus of claim 6, wherein the substrate is scanned between the first point and the second point along the scan axis, a first layer of the first material is deposited on the substrate, a second layer of the second material is deposited on the first layer, and a third layer of the third material is deposited on the second layer.

8. The apparatus of claim 3, wherein when the substrate is scanned in a first scan between the first point and the second point along the scan axis, a first layer of the first material is deposited on the substrate, a second layer of the second material is deposited on the first layer, and wherein when the substrate is scanned in a second scan between the first point and the second point along the scan axis a third layer of the third material is deposited on the second layer.

9. The apparatus of claim 1, wherein the first target portion and the second target portion adjoin one another, wherein the target assembly comprises a polygonal cross-section perpendicular to the scan axis.

10. An apparatus, comprising:
    an extraction assembly comprising at least a first extraction aperture and second extraction aperture, the extraction assembly configured to extract at least a first ion beam and second ion beam from a plasma chamber:
    a target assembly disposed adjacent the extraction assembly and including at least a first target portion comprising a first material and a second target portion comprising a second material, the first target portion and second target portion being disposed to intercept the first ion beam and second ion beam, respectively, wherein the first extraction aperture and the second extraction aperture are elongated along a first direction, wherein the first target portion and the second target portion extend parallel to the first extraction aperture and the second extraction aperture along the first direction;
    a substrate stage disposed adjacent the target assembly and configured to scan a substrate along a scan axis between a first point and a second point, wherein the first target portion and second target portion are separated from the first point by a first distance and second distance, respectively, the first distance being less than the second distance;
    a biasing system including a target bias supply to bias the target assembly negatively with respect to the plasma chamber, and a substrate bias supply to apply a substrate bias voltage to bias the substrate negatively with respect to the plasma chamber; and wherein the target assembly is disposed between the extraction assembly and the substrate, the substrate stage and the substrate are outside the plasma chamber, and wherein at least a portion of the target assembly extends into the plasma chamber.

11. The apparatus of claim 10, wherein when the substrate stage scans the substrate between the first point and second point, and the target bias supply biases the target assembly negatively with respect to the plasma chamber, a first layer of the first material is deposited on the substrate and the substrate is etched by the second ion beam.

12. The apparatus of claim 10, wherein when the substrate stage scans the substrate between the first point and second point, and the biasing system biases the target assembly negatively with respect to the plasma chamber, a first layer of the first material is deposited on the substrate and a second layer of a second material is deposited on the first layer.

* * * * *